United States Patent [19]

Sandhu

[11] Patent Number: 5,800,617
[45] Date of Patent: Sep. 1, 1998

[54] METHOD TO DEPOSIT HIGHLY CONFORMAL CVD FILMS

[75] Inventor: Gurtej S. Sandhu, Boise, Id.

[73] Assignee: Micron Technology, Inc., Boise, Id.

[21] Appl. No.: 841,297

[22] Filed: Apr. 29, 1997

Related U.S. Application Data

[62] Division of Ser. No. 472,323, Jun. 7, 1995, Pat. No. 5,641,545.

[51] Int. Cl.$^6$ .................................................. C23C 16/00
[52] U.S. Cl. .......................... 118/722; 118/715; 118/723 E
[58] Field of Search ........................... 118/715, 722, 118/723 E

[56] References Cited

U.S. PATENT DOCUMENTS

| | | | |
|---|---|---|---|
| 4,699,801 | 10/1987 | Ito | 427/53.1 |
| 4,849,260 | 7/1989 | Kusumoto | 427/250 |
| 4,872,947 | 10/1989 | Wang | 156/643 |
| 5,290,358 | 3/1994 | Rubloff | 118/715 |
| 5,393,577 | 2/1995 | Uesugi | 427/586 |
| 5,462,767 | 10/1995 | Yamazaki | 427/248.1 |

*Primary Examiner*—Richard Bueker
*Attorney, Agent, or Firm*—Fletcher, Yoder & Edwards

[57] ABSTRACT

A method for chemical vapor deposition onto high aspect ratio features. Process gases including a reactant species are supplied to the surface and sufficient primary energy is supplied to the surface so as to cause the reactant species to deposit on the surface. Additional energy is supplied, preferably in the form of optical energy, that is tuned to be captured by the patterned features so as to slow the deposition rate preferentially on the patterned features.

7 Claims, 4 Drawing Sheets

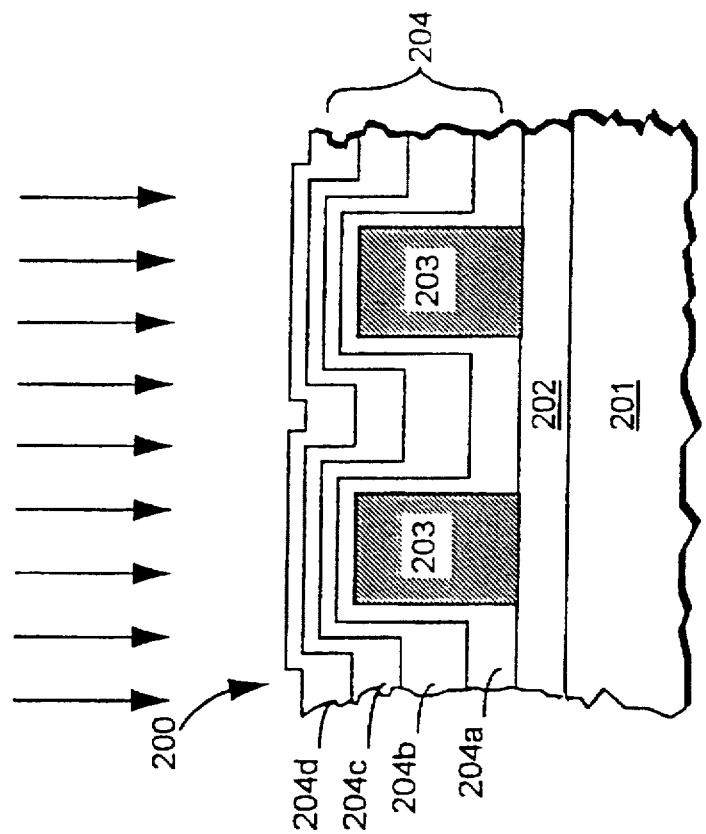
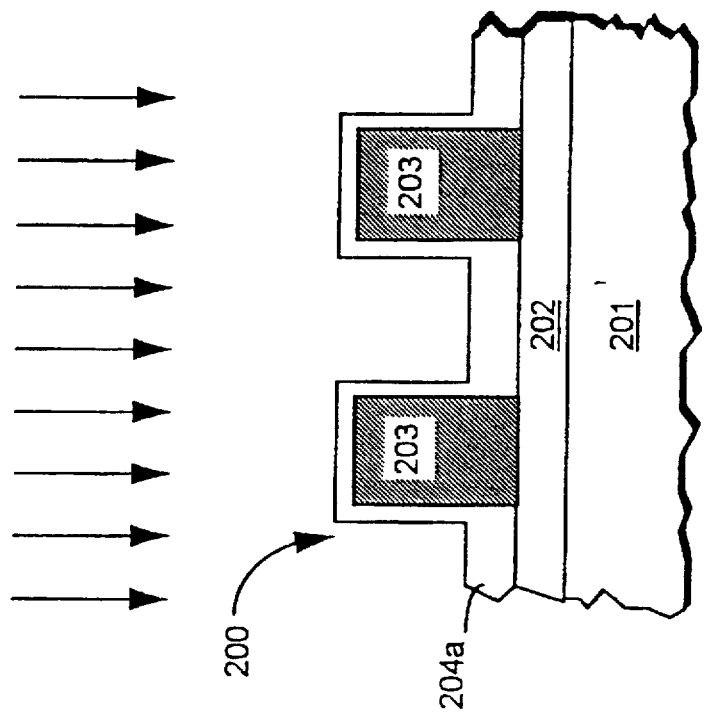
FIG. 3b
FIG. 3a

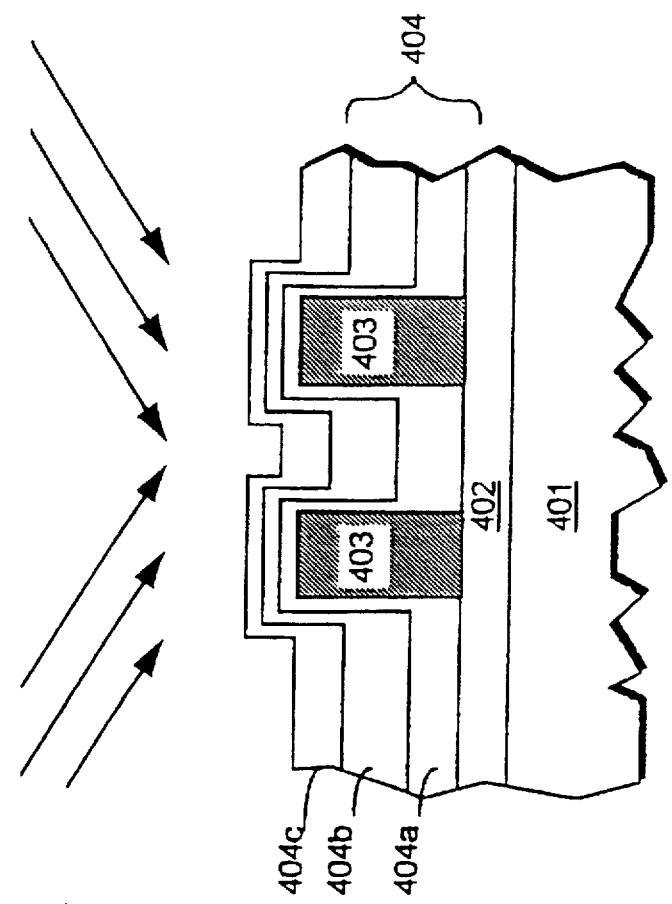
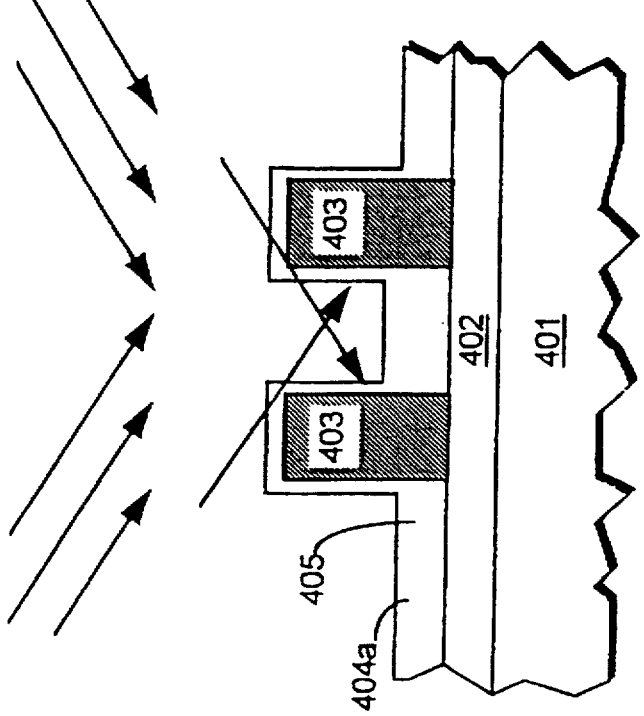

5,800,617

METHOD TO DEPOSIT HIGHLY CONFORMAL CVD FILMS

This application is a Divisional of application Ser. No. 08/472,323 filed Jan. 7, 1995 now U.S. Pat. No. 5,641,545.

BACKGROUND OF THE INVENTION

FIELD OF THE INVENTION

The present invention relates, in general, to chemical vapor deposition (CVD) apparatus and processes and, more particularly, to a method and apparatus for depositing highly conformal CVD films.

STATEMENT OF THE PROBLEM

Integrated circuit technology has advanced through continuing improvements in photolithographic processing so that smaller and smaller features can be patterned onto the surface of a substrate. Spaces or gaps exist between these patterned features. Integrated circuit surfaces also contain trench or "via" structures protruding down into the surface. The lateral dimension of such structures is hereafter referred to as the width of the gap, trench, or via; the vertical dimension of such structures is referred to as the depth. The aspect ratio is the ratio of depth to width.

The smaller features, with smaller spaces between features, result in gaps, trenches, and vias with high aspect ratios. These high aspect ratio structures must be filled with an appropriate material before continued processing. This problem is acute in the case of multiple layers metal (MLM) designs where dielectric must be deposited after each metal layer is formed and patterned before a subsequent metal layer can be formed and patterned.

When a deposited film is used to completely fill the high aspect ratio structure, three different results can occur. In one case, the deposited material-fills the trench without leaving a seam or void. In a second case, a seam arises from the point where the sidewall layers merge during deposition. In a third case, a void arises if the deposition produces re-entrant profiles at earlier stages of the filling process. The first case creates integrated circuits with the highest reliability. The seams and voids are undesirable, since chemicals or materials may be present in the seam or void to corrode or degrade the structure. Moreover, voids are rarely hermetically sealed, so subsequent exposure to chemicals or materials deposition can alter the material structure substantially.

Deposition onto trench and via structures is commonly practiced at several stages in the fabrication of semiconductor devices and interconnections. Most often the objective is to provide highly conformal films or void-free (and preferably seam-free) filling. The problem and challenge presented is that of trench structures with increasing aspect ratios, consistent with the trend toward higher lateral device density.

Low-pressure chemical vapor deposition (LPCVD) and plasma-enhanced chemical vapor deposition (PECVD) are widely used to provide conformal deposition of thin films over topography. Physical vapor deposition techniques (evaporation, sputter-deposition) are typically limited to structures with low aspect ratios. LPCVD processes offer better conformality and filling properties.

A number of chemical vapor deposited (CVD) films are currently used at various steps of integrated circuit manufacturing processes. Typically, sidewall coverage is not uniform along the height of a trench or via. A tapered shape has thicker sidewall coverage toward the bottom of the sidewall than toward the top, while the situation is reversed for a re-entrant shape. Generally speaking, the tapered shape is more desirable than the re-entrant shape, because in the latter the overhang of deposited material near the top of the trench shadows the region below, and the consequences of subsequent deposition can be ill-defined.

CVD processes operate by confining one or more semiconductor wafers in a chamber. The chamber is filled with one or more reactant gases that surround the wafer. Energy is supplied within the chamber and particularly to the reactant gases near the wafer surface. The energy activates the reactant gas chemistry to deposit a film from the gas onto the heated substrate. Such chemical vapor deposition of a solid onto a surface involves a heterogeneous surface reaction of the gaseous species that adsorb onto the surface. The rate of film growth and the quality of the film depend on the wafer surface temperature and on the gas species available.

More recently, low-temperature plasma-enhanced deposition and etching techniques have been used to form diverse materials, including metals such as aluminum and tungsten, dielectric films such as silicon nitride and silicon dioxide, and semiconductor films such as silicon. The plasma used in the PECVD is a low-pressure reactant gas that is developed in a radio frequency (RF) field. The RF plasma results in a very high electron temperature, making possible the deposition of dense, good quality films at lower temperatures and faster deposition rates than are typically possible using purely thermally activated CVD processes.

Current CVD processes have important limitations. With higher integration levels or higher performance structures, higher aspect ratios are required, stretching the ability of known CVD processes. Re-entrant profiles, seams, and voids all endanger the manufacturability of the semiconductor product due to yield and reliability problems. When higher growth temperatures improve conformality or profiles, other properties of the three-dimensional structure may be degraded (e.g., abrupt doping profiles due to diffusion). Alternatively, lower reaction probabilities ("reactive sticking coefficient") for well-chosen CVD chemistries can yield higher conformality, but throughput is degraded, making the approach less competitive. Thus, conventional CVD processes may not be capable of achieving the three-dimensional profiles and filling characteristics needed for next-generation technologies.

Step coverage for CVD films is a continuing problem in the integrated circuit manufacturing industry. A method and apparatus are needed for highly conformal CVD deposition, particularly deposition of oxide films.

SOLUTION TO THE PROBLEM

The present invention is directed to providing a CVD process offering controlled deposited layer thickness over three-dimensional patterned features and trench and via structures. The present invention provides the ability to control how the thickness of the deposited layer varies along bottom, sidewall, and top surfaces of high aspect ratio features patterned on an integrated circuit. The invention permits controlled shaping of thin film layers including, for example, (1) tapered rather than re-entrant shapes (i.e., thicker at the bottom rather than at the top), (2) enhanced sidewall and/or bottom coverage of trench structures, (3) voidless, seamless filling even at high aspect ratios, and (4) asymmetric sidewall coverage.

SUMMARY OF THE INVENTION

The present invention involves a method for chemical vapor deposition onto high aspect ratio features. Process gases including a reactant species are supplied to the surface and sufficient primary energy is supplied to the surface so as to cause the reactant species to deposit on the surface. Additional energy is supplied, preferably in the form of optical energy, that is tuned to be captured by the patterned features so as to slow the deposition rate preferentially on the patterned features.

BRIEF DESCRIPTION OF THE DRAWING

FIG. 3a and FIG. 3b illustrate in cross-section a semiconductor wafer at various stages in processing in accordance with the present invention; and FIG. 4a and FIG. 4b illustrate in cross-section a portion of a semiconductor substrate at various stages of a second embodiment process in accordance with the present invention.

DETAILED DESCRIPTION OF THE DRAWING

1. Overview.

Figure 1:
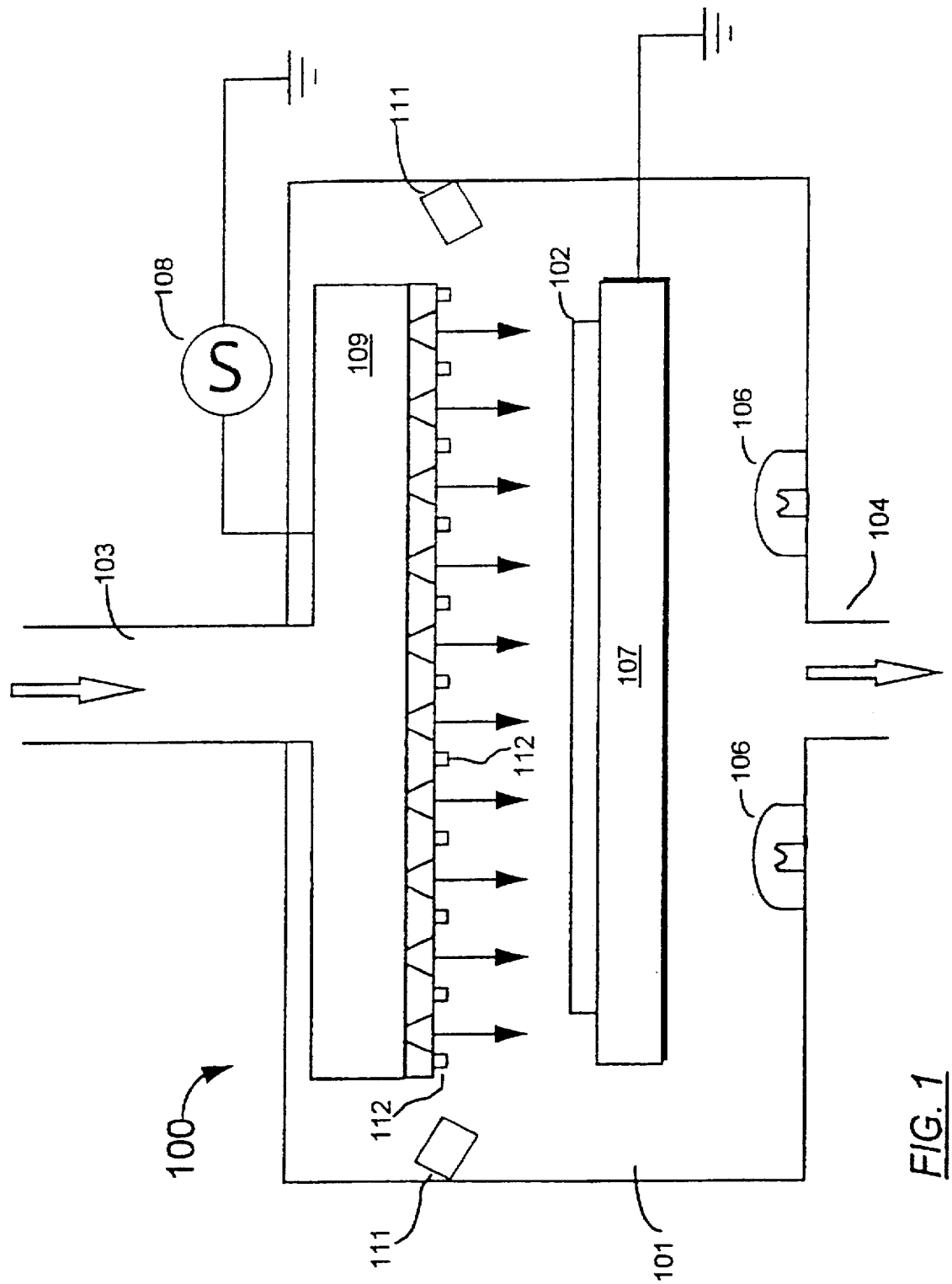
FIG. 1 illustrates in schematic form major components of the deposition apparatus in accordance with the present invention.

The present invention relates to a chemical vapor deposition (CVD) reactor 100 shown in FIG. 1 and a method for depositing CVD films. Chamber 101 is a pressure-sealed compartment for mounting a wafer 102 on susceptor 107. Chamber 101 is typically manufactured from aluminum and is designed to contain a low-pressure environment around wafer 102 as well as to contain process gases, exhaust gases, and plasma energy within chamber 101. Inlet gas manifold 103 supplies reactant gases at a controlled flow rate to wafer 102. Chamber 101 also incorporates a pumping system (not shown) for exhausting spent gases from chamber 101 through exhaust port 104.

CVD reactor 100 includes means for supplying energy to the reactant species in the process gases on the surface of the wafer 102. The supplied energy, hereinafter referred to as the primary energy, causes the reactant species to react or decompose and deposit a thin film onto an upper surface of wafer 102. Common means for supplying the primary energy include thermal energy supplied by heat lamps 106 in the base of chamber 101. Heat lamps 106 emit a significant amount of near-infra red radiation that passes through susceptor 107 to heat wafer 102. Alternatively, susceptor 107 can be heated by heat lamps 106 and wafer 102 can be heated by conduction from susceptor 107.

Another common method to supply the primary reaction energy is with a radio frequency (RF) generator 108 as shown in FIG. 1. RF generator 108 creates an RF field between wafer 102 and an anode. In the embodiment shown in FIG. 1, susceptor 107 is grounded while the RF signal is applied to a process gas manifold 109. Alternative and equivalent CVD reactor designs are well known. An RF anode may be provided separately (not shown) and process gas manifold 109 may be electrically isolated from the RF supply. Also, the RF signal can be applied to susceptor 102 and process gas manifold 109 can be grounded.

In general, the primary energy sources 106 and 108 are intended to provide sufficient reaction energy in a region near the surface of wafer 102 to cause decomposition and deposit of the reactant species in the process gases. Any means of supplying sufficient primary energy is adequate for the purposes of the present invention.

An important feature of CVD reactor 100 in accordance with the present invention is the inclusion of secondary energy means 111 and 112. As shown in FIG. 1, secondary energy means 112 are integrated with process gas manifold 109 so that they face directly opposite the surface of wafer 102. In accordance with the preferred embodiment, secondary energy sources 111 and 112 are light- or optical energy-emitting devices having either a wide bandwidth or a narrow preselected bandwidth. Secondary energy sources 112 are aimed such that the light emitted from them is perpendicularly incident on the surface of wafer 102. That is to say, the secondary energy sources 112 produce light that is aimed directly at the surface of the wafer 102 and is preferably collimated sufficiently so that the majority of the light produced is perpendicularly incident on wafer 102.

Alternatively, the secondary energy source 112 may be placed behind gas manifold 109 with spaces cut in gas manifold 109 to allow the light to pass through to the surface of wafer 102. In this case, gas manifold 109 can be structured to perform the collimating function.

The secondary energy source, whether wide band or narrow band, has a bandwidth selected to interact with the wafer 102 during the CVD process. As described in greater detail below, the bandwidth is selected to preferentially heat patterned features formed on the surface of the wafer 102 in a first embodiment. In a second embodiment, the wavelength is selected to desorb the reactant gas during the CVD reaction wherever the light strikes the surface of the wafer.

Secondary energy sources 111 in FIG. 1 are aimed to provide light incident on the wafer 102 surface at an oblique angle. This not only eases construction of CVD reactor 100, but also allows patterned features, especially patterned features with high aspect ratios, to provide shadows. This shadow feature can further enhance the utility of the present invention in many instances as is described in greater detail below.

CVD reactor 100 is illustrated as a single wafer reactor, but it should be understood that the present invention is applicable to batch reactors of conventional design. The preferred embodiment includes plasma reactors because these allow film deposition at lower temperatures and are preferable in the semiconductor industry. However, some reactant species in the process gases may deposit at low temperatures using only thermal energy or other primary energy sources well known in the industry. Hence, the present invention encompasses reactor designs using only a single primary energy source including either thermal heating, RF plasma, or the like.

Although the preferred embodiment is described in terms of a tetraethylorthosilicate (TEOS) deposition, the teachings of the present invention are applicable to any reagent gas or CVD deposition technology in which the reactant species has a negative activation energy. A negative activation energy means that as more energy is supplied to the surface upon which the film is depositing, the deposition rate decreases. TEOS is one example of such a negative activation energy film, but other examples are known. These and other variations of the specific embodiments described herein are considered equivalent to the claimed invention.

2. Method for depositing conformal CVD films.

Figure 2:
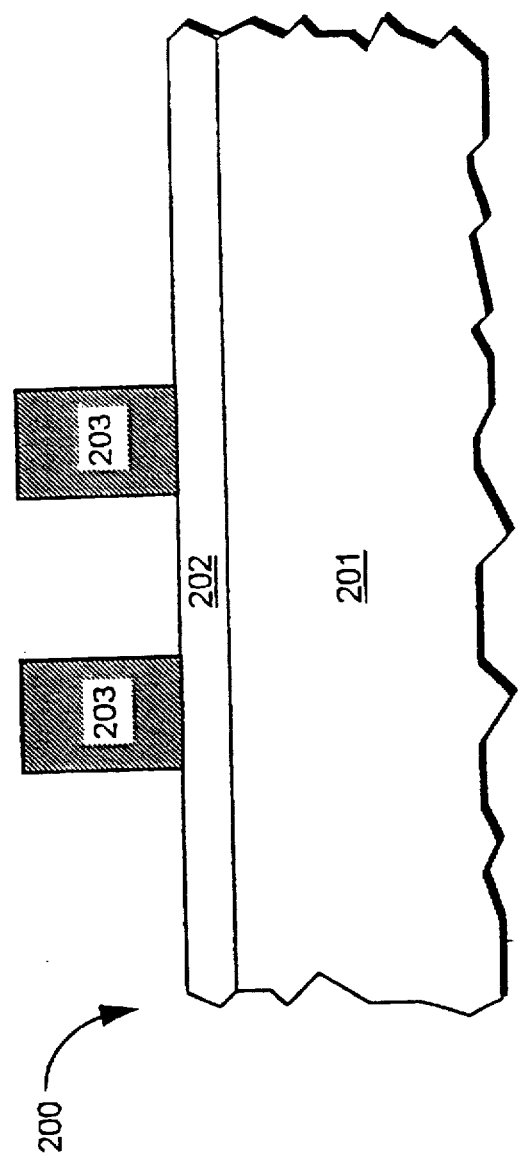
FIG. 2 illustrates in cross-section a portion of a patterned semiconductor substrate before processing in accordance with the present invention.

FIG. 2 illustrates a portion of a highly simplified semiconductor wafer 200. Wafer 200 comprises a semiconductor substrate 201 that may be silicon, gallium arsenide, or the like. Typical integrated circuit manufacturing places one or more layers of semiconductor material, dielectric material, or the like on top of semiconductor substrate 201. For example, in FIG. 2 surface layer 202 comprises a silicon dioxide layer. For ease of illustration, only one surface layer 202 is shown, but it is understood that many surface layers and structures may be formed on and in the surface of substrate 201. For ease of discussion, the term "upper surface" of substrate 201 as used herein includes all surface layers such as surface layer 202, as well as structures or semiconductor material substrate 201 used in a typical integrated circuit manufacturing process.

A plurality of patterned features are formed on the surface of the substrate such as metal lines 203. Metal lines 203 illustrate a high aspect ratio pattern in which the method and apparatus of the present invention are particularly useful. Conventional CVD processes have a limited ability to fill the space between metal lines 203. In accordance with a preferred implementation of the present invention a secondary energy source, indicated by the arrows in FIG. 3a, FIG. 3b, FIG. 4a and FIG. 4b, is directed at the upper surface of substrate 201 during the CVD process. In the first embodiment shown in FIG. 2, FIG. 3a and FIG. 3b, the light is directed perpendicularly to the surface of substrate 201 and the tops of patterned features 203.

FIG. 3a and FIG. 3b illustrate the CVD process at various stages of completion. As the light strikes patterned features 203 it is absorbed by patterned features 203 and they become hot. Also, the selected light gets absorbed preferentially by patterned features because that material has higher absorption coefficient. The light transmits through oxide on the substrate with very little absorption. When light strikes substrate 201, it has a large thermal mass that prevents a significant increase in temperature. As shown in FIG. 3a, during the CVD process, because the reagent gas has a negative activation energy, the deposition rate decreases on top of the hot patterned features 203. The deposition rate is not significantly affected at the surface of substrate 201. Hence, the initial deposition layer 204a has thick portions between patterned features 203 and a relatively thin covering on top of patterned features 203 and along the sidewalls of patterned features 203.

An added benefit of the method and apparatus in accordance with the present invention is that the decrease in sidewall growth rate prevents or inhibits formation of keyholes and voids in the fill area between features 203. Conventional conformal CVD processes that deposit on the sidewalls at essentially the same rate as depositing on the surface of substrate 201 result in the space between features 203 closing off before the space is completely filled.

Referring to FIG. 3b, subsequent deposition of layer 204 includes layers 204b, 204c, and 204d. As the CVD process continues, the inhibited deposition rate on top of features 203 results in a gradual planarization and conformal coating of patterned features 203. The space between patterned features 203 is filled more quickly than the deposit accrues on the top surfaces of patterned features 203. Even though the deposition on top of patterned features 203 does not stop completely, they continue to be locally heated by the secondary energy source, which results in a local decrease in deposition rate resulting in a profile similar to that shown in FIG. 3b.

FIG. 4a and 4b illustrate a second embodiment in accordance with the present invention. In the second embodiment, the secondary energy source is directed at an oblique angle toward an upper surface 402 of semiconductor substrate 401. The second energy source has the same result as the first embodiment-areas that are exposed to the secondary energy source locally heat and reduce deposition rate in those areas. When an oblique angle is used, patterned features 403 create a shadow in the space between them. Patterned features 403 will absorb secondary energy where the light impacts them directly. The oblique angle is preferably chosen so that sidewalls of patterned features 403 are exposed to the secondary energy and so are heated.

The secondary energy, as in the first embodiment, causes the reagent gas to desorb from the surface of the forming film 404 in areas where the light is incident. This results in faster filling at the base of the space between patterned features 403. In an optional embodiment the secondary energy is chosen to have a wavelength that directly causes the reactant species to desorb rather than cause desorption by thermal action alone. This results in an inhibited deposition rate wherever the light impacts features 403 or the upper surface 402 of substrate 401.

As shown in FIG. 4a, field region 405 of CVD layer 404a is exposed to the secondary energy and so has some diminished deposition rate due to the tuned wavelength desorption. Over the tops and sidewalls of patterned features 403, the deposition rate is further reduced by the interaction of both local heating and wavelength based desorption. In the area between patterned features 403, neither local heating nor wavelength based desorption processes occur, and deposition is greatest. As shown in FIG. 4b, as the process continues with deposition of layer portions 404b, 404c, and 404d, CVD layer 404 gradually planarizes as it conformally coats patterned features 403.

By now it should be appreciated that a method and apparatus for improved conformal CVD deposition is provided. Addition of a secondary energy source such as a light source or other source of electromagnetic energy aimed at the wafer in a CVD reactor improves the conformal coating abilities of the conventional CVD process. It should be understood that the secondary energy source in accordance with the present invention may be operated continuously, periodically, or for other time periods during the CVD deposition. The CVD deposition may be combined with etchback chemistry or other known alterations of conventional CVD deposition technology. The particular embodiments illustrated are applied to interlayer dielectric deposition, but other CVD film depositions can make use of the features of the apparatus and method of the present invention. These and other alterations are considered equivalent to the invention described and claimed herein.

We claim:

1. An apparatus for chemical vapor deposition (CVD) of a film onto a wafer, the wafer comprising a substrate and a plurality of patterned features formed on an upper surface of the substrate, the apparatus comprising:

a reaction chamber;

a susceptor for holding the wafer;

a reactant gas supply for providing reactant gas to the substrate;

a first energy source for supplying a first energy to the upper surface, wherein the first energy is sufficient to cause the reactant gas to deposit on the substrate;

a second energy source for supplying a second energy, wherein the second energy inhibits deposition of the film onto the patterned features.

2. The apparatus of claim 1 wherein the second energy is electromagnetic energy that heats the patterned features to a higher temperature than the upper surface of the substrate.

3. The apparatus of claim 1 wherein the second energy source is a light incident on the upper surface at a perpendicular angle.

4. The apparatus of claim 1 wherein the second energy source is a light incident on the upper surface at an oblique angle chosen to shade portions of the upper surface between the patterned features.

5. The apparatus of claim 1 wherein the second energy source has a wavelength chosen to desorb the reactant gas from the film.

6. The apparatus of claim 1 wherein the second energy source has a wavelength chosen to heat the patterned features more than the upper surface of the substrate.

7. The apparatus of claim 1 wherein the reactant gas comprises tetraethylorthosilicate.

* * * * *